United States Patent [19]

Ablassmeier

[11] 3,986,197

[45] Oct. 12, 1976

[54] CHARGE COUPLED TRANSFER ARRANGEMENT IN WHICH MAJORITY CARRIERS ARE USED FOR THE CHARGE TRANSFER

[75] Inventor: Ulrich Ablassmeier, Waltenhofen, Germany

[73] Assignee: Siemens Aktiengesellschaft, Berlin & Munich, Germany

[22] Filed: Jan. 3, 1975

[21] Appl. No.: 538,383

[30] Foreign Application Priority Data

Jan. 3, 1974 Germany.......................... 2400208

[52] U.S. Cl. .............................. 357/24; 307/221 D; 307/304
[51] Int. Cl.² ................... H01L 29/78; H03K 3/353
[58] Field of Search .......... 357/24; 307/221 D, 304

[56] References Cited
UNITED STATES PATENTS

| | | | |
|---|---|---|---|
| 3,656,011 | 4/1972 | Weinberg............................. | 357/24 |
| 3,758,794 | 9/1973 | Kosonocky .......................... | 357/24 |
| 3,819,959 | 6/1974 | Chang et al........................... | 357/24 |
| 3,852,799 | 12/1974 | Walden................................ | 357/24 |
| 3,858,232 | 12/1974 | Boyle et al........................... | 357/24 |
| 3,863,065 | 1/1975 | Kosonocky et al................... | 357/24 |

Primary Examiner—William D. Larkins
Assistant Examiner—Gene M. Munson
Attorney, Agent, or Firm—Hill, Gross, Simpson, Van Santen, Steadman, Chiara & Simpson

[57] ABSTRACT

A charge coupled transfer arrangement in which majority carriers are used for the charge transfer, in particular according to the peristaltic principle or according to the buried channel principle for the storage movement of electrical charges in a predetermined direction comprises a thin doped semiconductor layer on a high resistive material and a layer of insulating material arranged on the semiconductor layer. The insulating layer has a plurality of individual electrode arrangements disposed thereon for the movement of charges, the electrode arrangements being arranged in a row parallel to the predetermined direction of movement. Electrodes are also provided for charge input and charge output. Each electrode arrangement comprises at least two electrodes separated by a gap and extending parallel to the predetermined direction.

5 Claims, 3 Drawing Figures

CHARGE COUPLED TRANSFER ARRANGEMENT IN WHICH MAJORITY CARRIERS ARE USED FOR THE CHARGE TRANSFER

BACKGROUND OF THE INVENTION

1. Field of the Invention

The present invention relates to a charge coupled transfer arrangement in which majority carriers are used for the charge transfer, in particular according to the peristaltic principle or according to the buried channel principle for the storage and movement of electrical charges in a predetermined direction, and more particularly to a charge coupled transfer arrangement which comprises a thin doped semiconductor layer on material which is highly resistive with respect to the semiconductor layer, and a layer consisting of insulating material arranged on the semiconductor layer on which insulation are disposed means for feeding the charges, several individual electrode arrangements disposed in a row parallel to the given direction to serve for movement of the charges, and means for removing the charges.

2. Description of the Prior Art

Transfer arrangements of the initially mentioned type are known in the art and are described, for example, by L. J. M. Esser in his article Peristaltic CCD: A New Type of Charge Transfer Device, in the periodical Electronics Letters Dec. 14, 1972, Vo. 8, No. 25, Pages 620–621, in the German published applicaton 2,252,148, and by R. H. Walden in his article The Buried Channel CCD, in the Bell System Technical Journal, Vol. 51, Sept. 1972, No. 7, Pages 1635–1640. Such arrangements consist of a thin doped semiconductor layer on material which is highly resistive in relation thereto, and a layer consisting of insulating material arranged on the semiconductor layer. The insulating layer carries means for feeding in charges, several individual electrodes for moving the charges, which are arranged in a row parallel to a predetermined transfer direction, and output means for removing the charges. During production, one proceeds from an epitaxial layer on a high resistive semiconductor body. Voltage pulses are applied to the electrodes as is done with the conventional charge coupled element.

The primary different between this type of element and the conventional element resides in the fact that the charge transfer takes place primarily in the interior of the semiconductor layer and that majority charge carriers are used for the charge transfer.

The transfer of the charge from one electrode to the next electrode takes place in such a way that by means of applying appropriate amounts of voltages to the electrodes, the cross section of the current carrying portion in the semiconductor layer is changed. For example, if the current carrying cross section below an electrode is reduced, and if it is expanded at the same time at an adjacent electrode, the current then flows to the adjacent electrode. When sufficiently high voltages are applied to an electrode, the current carrying cross section becomes infinitely small, i.e. the entire semiconductor below the electrode is practically free of majority carriers. The entire charge is then located below an adjacent electrode. Transfer arrangements of the type mentioned above are characterized by particularly favorable electrical features, among other things, by small tranfer losses and high transfer frequencies.

However, the charge movement from one electrode to the next can function in transfer arrangements of the initially mentioned kind only if the charge cannot flow laterally from the row of electrodes. For this reason, a transfer channel is necessary in such elements below the row of electrodes, the transfer channel being laterally insulated with respect to its surroundings. When producing this kind of transfer arrangements, this insulation, however, requires additional method steps which are not necessary with conventional elements.

SUMMARY OF THE INVENTION

The present invention has the primary object of providing charge transfer arrangements of the type mentioned above which are constructed in a more simple manner, and during which production the additional method steps for the insulation of the transfer channel with respect to its surroundings, in particular against adjacent transfer elements, can be avoided.

This object is achieved and the aforementioned problems are solved, according to the invention, in that each charge transfer electrode arrangement comprises at least two electrodes which extend transversely of the predetermined direction of charge transfer and which are separated by a gap, the gaps of the arrangements extending parallel to the direction of charge transfer. The electrode arrangements are utilized simultaneously for charge transfer and for the insulation of the transfer channel with respect to its surroundings. The semiconductor layer below the electrodes and below the interstices between the electrodes, with the exception of the gaps lying parallel to the given direction, is cleared of majority carriers through the application of a direct voltage U to all electrodes. The charges are transferred from one electrode arrangement to the next in the doped semiconductor layer below the gaps parallel to the predetermined direction, with the aid of timed voltage pulses.

The advantage of the transfer arrangement constructed according to the invention resides in the fact that the electrodes can be applied over a homogeneously doped semiconductor layer so that the additional method steps for insulating the transfer channel can be eliminated and the production of the arrangement thus simplified.

A transfer arrangement constructed according to the invention may also be designed in such a way that in each electrode arrangement the insulating layer has a greater layer thickness in at least a portion in the gap area and therefore extending parallel to the predetermined direction, than the thickness below the electrodes, and that the electrodes of an electrode arrangement which are separated by such a gap are connected with each other by means of a conductive material which bridges the thicker portion of the layer. The advantage of this arrangement lies in the fact that more charge can be moved and the number of terminal contacts is reduced.

The transfer arrangements, according to the invention, are preferably designed in such a way that the means for feeding charges in and the means for removing charges comprise at least one electrode.

The advantages which may be achieved with the invention comprise particularly the fact that as many transfer arrangements as desired can be arranged next to each other over a homogeneously doped semiconductor layer without having to separate the individual elements by intermediate insulating layers. In this manner, transfer arrangements of the type initially mentioned can be constructed very easily in the form of storage matrices. Due to the simple design, high packing densities and greater outputs can be achieved.

BRIEF DESCRIPTION OF THE DRAWINGS

Other objects, features and advantages of the invention, its organization, construction and operation will be best understood from the following detailed description taken in conjunction with the accompanying drawings, on which.

DESCRIPTION OF THE PREFERRED EMBODIMENTS

Figure 1:
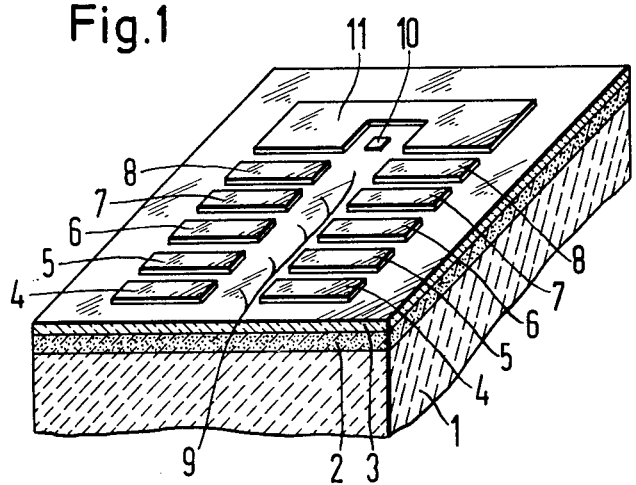
FIG. 1 illustrates a transfer arrangement in which each electrode arrangement comprises two electrodes which are separated by a gap.

In FIG. 1, a thin doped semiconductor layer 2, e.g. n-doped silicon, is carried on a material 1, e.g. p-doped silicon, which is highly resistive with respect to the semiconductor layer 2. An insulating layer 3, for example silicon dioxide, is carried on the thin semi-conductor layer 2.

As a means for feeding in charges, a pair of electrodes 4 separated by a gap 9 are provided and carried on the insulating layer 3.

As a means for charge output, a contact 10 and an electrode 11 are also carried on the insulating layer 3.

For charge transfer each electrode arrangement comprises pairs of electrodes 5, 5; 6, 6; 7, 7; and 8, 8, each of the individual electrodes of each pair extending transversely of the predetermined direction of charge movement and separated by a gap 9. The electrodes on each side of the gaps 9, and the gaps 9 themselves, are aligned parallel to the predetermined direction of charge transfer.

A direct voltage U is applied to all electrodes to guarantee that the semiconductor layer 2 below the electrodes and below the interstices between the electrodes, with the exception of the areas below the gaps 9, are cleared of majority carriers. This requires that the gaps 9 be wider than the remaining interstices between the electrodes 5-8.

The charges are transferred from one electrode arrangement to the next electrode arrangement in the doped semiconductor layer 2 below the gaps 9. The charge transfer takes place in such a manner that the two electrodes of each arrangement are connected to a pulse line, and that by means of applying pulse voltages in addition to the voltage U, the cross section of the current carrying portion in the semiconductor layer below the gaps 9 parallel to the surface is changed. The width of the gap 9 must be selected in such a way that when the maximum voltage is applied, the semiconductor is cleared of majority carriers. The gap width lies in a range of between 2 and 20 $\mu$m.

In order to feed in charges, the pair of electrodes 4, 4 is connected to an input pulse line.

Connections are made to the contact 10 to remove output signals corresponding to the transfer charges.

The electrode 11 prevents leakage of the charges from the element.

Charges can also be fed in by a contact structure which is constructed in the same manner as that for removing charges.

Figure 2:
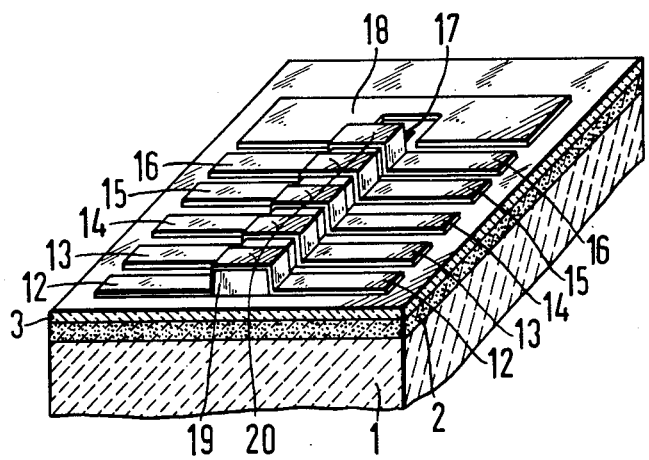
FIG. 2 illustrates a transfer arrangement in which each electrode arrangement comprises two electrodes which are connected with each other by conductive material over a thicker portion of an insulating layer in the area of the gaps.

Referring to FIG. 2, the insulating layer 3 includes an area of greater layer thickness 19 in the area of the gaps between the two electrodes of each electrode arrangement, here referenced 13, 13; 14, 14; 15, 15; and 16, 16. The electrodes of each arrangement are connected with each other by a conductive material 20 which extends over the area of greater layer thickness 19. Suitably, the same material may be used for the material 20 as for the electrodes.

Upon the application of an appropriate voltage U, the semiconductor layer below the thin insulating layer is cleared, whereas below the thicker portion 19 of the layer, a complete clearance of moving charge carriers occurs only if a still greater voltage is applied. The charge is then moved below the area having a greater layer thickness. With this structure, the layer portion 19 below which the charge is moved can be wider than the gap 9 in the arrangement of FIG. 1. Therefore, more charge can be moved.

A pair of electrodes 12, 12 is provided as a charge feed in means. The electrodes 12, 12 are also connected over the thicker portion 19 by the conductive material 20.

A contact 17 is provided as an output means and an electrode 18 prevents charge leakage from the element.

Figure 3:
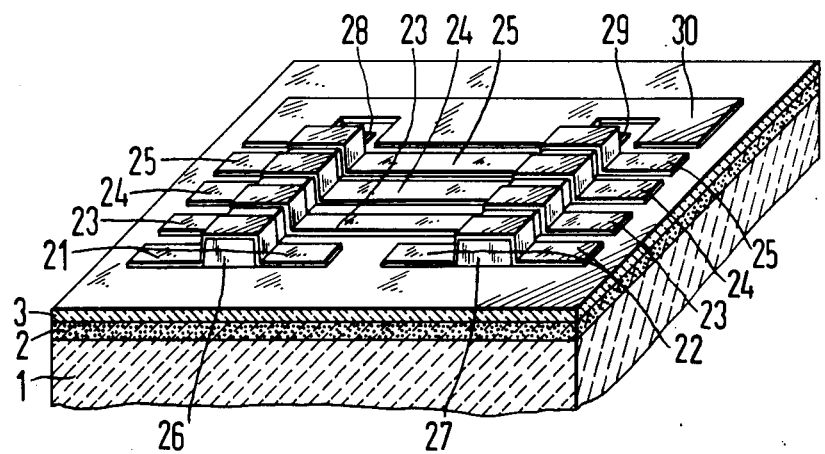
FIG. 3 illustrates a transfer arrangement in which each electrode arrangement comprises three electrodes which are connected with each other by conductive material which bridges two thicker portions of the insulating layer in the area of the gaps.

Referring to FIG. 3, the charges are moved below two strips 26, 27 of greater thickness of the layer 3. The electrodes of each electrode arrangement (23, 23, 23; 24, 24, 24; and 25, 25, 25) are connected with each other by conductive material which bridges the strips 26 and 27 of the layer 3, in the same manner as the conductive bridging in FIG. 2. The movement of charges is carried out in both channels by a common pulse line.

The means for the input of charges comprises two pairs of electrodes 21, 21 and 22, 22, the electrodes of each pair being connected by conductive material which bridges the respective strips 26, 27 of greater thickness in the insulating layer 3. Each electrode pair 21, 21 and 22, 22 is connected to an input pulse line.

The charges can be removed at the contacts 28 and 29, respectively, for each channel.

A common electrode 30 which spans each channel prevents the leakage of charges, in a manner similar to that for the arrangements of FIGS. 1 and 2.

The charge transfer arrangement illustrated in FIG. 3 may be employed, for example, as a simple storage matrix.

In producing charge transfer arrangements according to the invention, one can also proceed for an epitaxial layer on a high resistive semiconductor. However, any other method which guarantees that the semiconductor layer below the electrodes is safely cleared, is also suitable. Therefore, the elements could be produced with an implanted layer, or in accordance with the ESFI-MOS (epitaxial silicon film on insulator-metal-oxide-semiconductor) technique instead of with an epitaxial layer. In addition to the electrodes, also the boundary surface charges on the boundary layer between the epitaxial layer and the spinel insulating layer aid in clearing out the epitaxial layer.

The charge transfer arrangements described herein can function in three-phase operation and in two-phase operation. As is done with conventional elements which operate on the basis of minority carrier movement, one can utilize silicon-aluminum electrodes for this purpose.

In summary, the present invention provides an improvement in a charge coupled transfer arrangement in which the charge transfer electrode arrangement comprises a plurality of groups of electrodes in which the individual electrodes of each group extends laterally of the predetermined direction of charge movement and are separated from adjacent electrodes of the same group by a gap, the groups of electrodes being aligned spaced apart in the predetermined direction of charge movement. More specifically, a single channel arrangement has been disclosed in which each group of electrodes comprises a pair of electrodes extending transversely to the direction of charge movement and separated by gaps, the groups of electrodes extend along an insulating layer parallel to the direction of charge movement. The gap area may include a thickened portion of the insulating layer over which the individual electrodes of a group are conductively bridged and beneath which a greater amount of charge may be moved than with the simple gap structure. Also, a dual channel arrangement constructed with a pair of such thickened portions of the insulating layer has been disclosed in which each group of electrodes comprises three, rather than two, electrodes, the individual electrodes of each group being aligned transversely of the direction of charge movement and the groups of electrodes being aligned parallel to the direction of charge transfer.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A charge coupled transfer arrangement comprising a thin doped semiconductor layer of one conductivity type having majority carriers, a highly resistive material in relation to said semiconductor layer and carrying said semiconductor layer, an insulating layer carried on said semiconductor layer, input electrode means carried on said insulating layer, output electrode means carried on said insulating layer, a plurality of groups of electrodes carried on said insulating layer, said groups of electrodes aligned spaced apart in a row parallel to a predetermined direction of charge transfer and each of said groups comprising individual electrodes extending laterally of said predetermined direction and separated from adjacent electrodes of the same group by respective gaps, means for applying voltages, of such polarity as to repel majority carriers in said semiconductor layer, to said electrodes to transfer said electrical majority carriers adjacent to said row in said direction in said semiconductor layer below said gaps, and means for applying voltage to clear said semiconductor layer of said majority carriers below said electrodes with the exception of areas below said gaps.

2. The charge coupled transfer arrangement according to claim 1, wherein said input electrode means and said output electrode means each include at least one electrode.

3. The charge coupled transfer arrangement according to claim 1, wherein said gaps are aligned, said insulating layer comprises a thicker portion extending parallel to said predetermined direction in the area of aligned gaps, and comprising a conductive layer connecting the adjacent electrodes of the same group of electrodes laterally across said thicker portion.

4. The charge coupled transfer arrangement according to claim 3, wherein each group of electrodes comprises a pair of electrodes.

5. The charge coupled transfer arrangement according to claim 3, wherein each group of electrodes comprises three electrodes separated by two gaps, said insulating layer comprises two thicker portions each in a respective gap area, and said conductive layer includes two sections each bridging a respective thicker portion of said insulating layer.

* * * * *